United States Patent [19]
Golla

[11] Patent Number: 5,546,405
[45] Date of Patent: Aug. 13, 1996

[54] DEBUG APPARATUS FOR AN AUTOMATED SEMICONDUCTOR TESTING SYSTEM

[75] Inventor: Naidu G. Golla, Austin, Tex.

[73] Assignee: Advanced Micro Devices, Inc., Sunnyvale, Calif.

[21] Appl. No.: 502,924

[22] Filed: Jul. 17, 1995

[51] Int. Cl.⁶ ................................................. G01R 31/28
[52] U.S. Cl. ...................... 371/22.1; 371/22.6; 324/754
[58] Field of Search .................................. 324/754, 760, 324/755, 158; 371/22.1, 22.6, 27, 72

[56] References Cited

U.S. PATENT DOCUMENTS

| | | | |
|---|---|---|---|
| 4,517,512 | 5/1985 | Petrich et al. | 324/73 |
| 4,604,744 | 8/1986 | Littlebury et al. | 371/20 |
| 5,489,852 | 2/1996 | Gomez | 324/754 |

Primary Examiner—Vincent P. Canney
Attorney, Agent, or Firm—Kevin L. Daffer

[57] ABSTRACT

Two embodiments of an integrated circuit debug apparatus are described. In one embodiment, a test head is provided which houses channel cards configured with switches. The switches selectively connect channels of the channel card to a device signal panel attached to the test head. Connection pins on the device signal panel may be coupled to various debug devices to allow debug of the device under test. The conductors which connect the device signal panel to the switch may be short compared to conductors which connect the test head to the integrated circuit tester. Therefore, debugging may be performed with the tests executing at higher clock rates than clock rates generated by debug equipment within the integrated circuit tester. A second embodiment is described in which ribbon cable connectors are added to the probe card used in the prober. Ribbon cables are coupled between the ribbon cable connectors and a device signal panel. Both embodiments allow debugging to be performed while the integrated circuit is within the tester, allowing rapid problem determination and resolution.

23 Claims, 6 Drawing Sheets

DEBUG APPARATUS FOR AN AUTOMATED SEMICONDUCTOR TESTING SYSTEM

BACKGROUND OF THE INVENTION

1. Field of the Invention

This invention relates to automated semiconductor test equipment and, more particularly, to debug facilities for use with automated semiconductor test equipment.

2. Description of the Relevant Art

Integrated circuits are widely used in a variety of products, from computer systems to automobiles. Integrated circuits embody a variety of electrical components (such as transistors, capacitors, and resistors) on a single monolithic semiconductor substrate. By combining these individual electrical components into a single device, manufacturing costs for the product and the size of the product are decreased. Manufacturing costs are decreased because the product contains fewer discrete components (to purchase and to assemble). Size is decreased because electrical components fabricated within an integrated circuit may be placed closer together than a similar set of discrete electrical components.

Integrated circuits are fabricated through a multi-step process. Impurities are selectively implanted into areas of a highly purified semiconductor substrate. Thereafter metal conductors are patterned across the surface of the semiconductor substrate. Metal conductors extend between implant regions to form the monolithic electrical circuit. Typically, multiple copies of the integrated circuit are fabricated simultaneously on a single semiconductor substrate, referred to as a wafer. After fabrication, the individual integrated circuits are "diced". Dicing is the process of separating the integrated circuits from each other and the remaining portions of the wafer. Individual integrated circuits are packaged in one of many types of integrated circuit packages. The packages protect the integrated circuit from automated assembly machines that are typically used to place the integrated circuit into a product. Packages also provide an electrical connection in the form of pins which extend from the package. The pins are often subjected to more stressful conditions than the packaged integrated circuit. For example, pins are designed to withstand high insertion forces and high solder temperatures, while a semiconductor substrate is generally protected within the package from such conditions.

The pins of an integrated circuit package are connected to input/output bonding pads on the integrated circuit substrate. Input/output bonding pads are relatively large areas of conductive material formed onto the integrated circuit during metallization. The input/output bonding pads are electrically connected to circuits on the integrated circuit substrate via metal conductors. These circuits provide communicative signals to devices that may be connected to the integrated circuit when it is used in a product.

As with many manufactured devices, some integrated circuits will not function properly when manufactured. Defects may be introduced during any of the fabrication steps such as implantation, metallization, dicing, etc. Defects may also occur during packaging. Therefore, integrated circuits are tested before they are used in products. Furthermore, integrated circuits are tested after fabrication but prior to being packaged (i.e. while the integrated circuits are still a part of the wafer). In the latter instance, packaging costs are saved if defective integrated circuits are discovered and not packaged. It is noted that once an integrated circuit is packaged, it typically cannot be removed from the package without destroying the package. Post-packaging testing is still employed even after individual die are tested as part of a wafer. Post-packaging tests are desirable to more fully determine circuit operability, but also detect damage possibly resulting from packaging.

Automated semiconductor test equipment is employed to test integrated circuit die while still a part of the wafer and after being packaged. Testing performed upon integrated circuits which are still a part of a wafer is referred to as wafer test, and post-packaging testing is referred to as chip test. Several tests are performed by the automated semiconductor testing equipment, including: power pin short tests, pin short tests, pin open tests, functional Vcc min/max tests, leakage current tests, Vol/Voh tests, static Icc tests, and dynamic Icc tests.

Power pin short tests check for electrical shorts from power supply pins (or power supply input/output pads in wafer test) to other pins or to ground. If a power supply pin is shorted, the circuits connected to that power supply pin will not function. Therefore, the integrated circuit is defective.

Pin short tests (or pad short tests in wafer test) check for signal pins that are shorted to other pins or to ground or power supply pins. A signal pin (or pad) is a pin (or pad) which conveys an electrical signal during use. Signal pins that are shorted will not convey the correct signal from the integrated circuit, and so the integrated circuit is defective.

Pin open tests (pad open tests in wafer test) check for pins that are not connected correctly such that no electrical current may flow from the pin to the pad or from the pad to the circuits embodied within the integrated circuit. If a pin is open, then it will not convey the correct signal from the integrated circuit, and so the integrated circuit is defective.

Functional Vcc min/max tests first power the integrated circuit with a power supply voltage at the minimum and maximum value specified for the integrated circuit. The integrated circuit is expected to operate properly within a power supply voltage range bound by the specified minimum and maximum values. Functional patterns of signals are applied to the input/output pins (pads) of the integrated circuit and expected results on other pins (pads) are checked. Functional patterns are sequential patterns of input signals which represent a sequence of input signals that might be applied to the integrated circuit when in use within a product, along with the expected sequence of output signals that the integrated circuit should produce if operating properly. If a result does not match the expected value, then the integrated circuit does not function properly within its specified power supply range. Therefore, the integrated circuit is defective.

Leakage current tests are typically applied to an integrated circuit which is powered and held in reset state. None of the internal circuits of the integrated circuit are switching in this configuration, so the electrical current that may be drawn by the integrated circuit is leakage current associated with transistors embodied upon the integrated circuit. If the measured leakage current is larger than a specified amount (typically a few microamperes), then the integrated circuit is defective.

Vol/Voh tests check the voltages that are produced on each output pin (or pad in wafer test). Vol/Voh tests ensure that the voltage level conveyed on a particular output pin is below a Vol level specified for the integrated circuit when the pin is conveying a logical zero value. Additionally, Vol/Voh tests ensure that the voltage level conveyed on a particular output pin is above a Voh level specified for the integrated circuit when the pin is conveying a logical one value.

Static and dynamic Icc tests check the current drawn from the power supply pins by an integrated circuit. If the current drawn is above a level specified for the integrated circuit, then the integrated circuit is deemed defective. A static Icc test is performed upon an integrated circuit after appropriate voltages have been applied to its power and ground pins and the integrated circuit has been reset to an idle state. The inputs to the integrated circuit are held constant (including the clocking input) and the current is measured. Conversely, a dynamic Icc test is performed upon an integrated circuit while the test equipment repeatedly performs a test designed to cause as many transistors as possible to switch within the integrated circuit. The dynamic current is measured several times and averaged.

The above tests are but a few of the many possible tests useable upon a wafer or chip. Tests are chosen depending upon the applicability of the product within which the integrated circuit is placed. Additional tests will not be discussed for sake of brevity, however, it is understood that any test procedure initiated by any type of test equipment falls within the spirit and scope of the present discussion.

When a relatively large number of integrated circuits are being found defective at wafer test or at chip test, then debugging needs to be performed to determine the cause of these defects. Also, when a newly designed integrated circuit is being fabricated for the first time, a large number of defects may indicate a significant problem with the new design or a problem with interfacing to the automated semiconductor test equipment. Sometimes, the test equipment is not aligned to the integrated circuit correctly. If a proper electrical connection is not made between the test equipment and the integrated circuit, then tests will indicate defects even though the integrated circuit is not defective.

Unfortunately, typical automated semiconductor test equipment provides only a limited debug capability. For example, automated test equipment often provides an oscilloscope to observe voltage and current levels on various pins (or pads). However, the oscilloscope is typically located a large distance from the integrated circuit being tested (referred to as the device under test, or "DUT"). The long electrical leads connecting the oscilloscope to the DUT have an associated large inductive impedance which limits the frequency at which values may be sensed. The frequency limits might be quite severe depending upon the length of the electrical leads. It is not uncommon to encounter a 25 MHz upper frequency limit for testers having the oscilloscope displaced from the DUT by several feet. Modern integrated circuits, however, are being designed with an emphasis on speed. Clock frequencies of the core devices routinely operate at speeds exceeding, for example, 25 MHz. Accordingly, conventional debugging capabilities are insufficient for high speed devices. Additionally, debug devices such as oscilloscopes and logic analyzers cannot be connected to the DUT directly due to the configuration of the tester interface apparatus, as will be described below. It is desirable that the test equipment be enhanced to allow a more advanced level of debugging.

SUMMARY OF THE INVENTION

The problems outlined above are in large part solved by an integrated circuit debug apparatus according to the present invention. Two embodiments of the debug apparatus are described. In one embodiment, a test head is provided which houses channel cards configured with switches. The switches are under the control of the integrated circuit tester (which in turn is under the control of the operator via software executing on a connected computer terminal). The switches selectively connect channels of the channel card to a device signal panel attached to the test head. Connection pins on the device signal panel may be coupled to various debug devices to allow debug of the device under test. The conductors which connect the device signal panel to the switch may be advantageously short compared to conductors which connect the test head to the integrated circuit tester. Therefore, debugging may be performed with the tests executing at higher clock rates than clock rates possible using the debug equipment within the integrated circuit tester. In this embodiment, each channel is independently connectable to the device signal panel.

A second embodiment is also described in which ribbon cable connectors are added to the probe card used in the prober. Each pin of the ribbon cable connector is coupled to a conductive pad which is electrically coupled (during use) to a particular input/output pad of the DUT. Ribbon cables are coupled between the ribbon cable connectors and a device signal panel. In this embodiment, the device signal panel is coupled to the prober. Again, the conductors which convey the signals from the DUT to the device signal panel are relatively short compared to the conductors which connect the test head to the integrated circuit tester. Therefore, debugging may be advantageously performed with tests executing at a higher clock rate than the clock rate possible with the integrated circuit tester debug facilities. Additionally, both embodiments allow debugging to be performed while the DUT is within the tester. This capability speeds the debug process, allowing rapid problem determination and resolution.

The present invention contemplates an integrated circuit debug apparatus comprising a test head, a plurality of channel cards coupled into the test head, and a device signal panel coupled to the test head and electrically coupled to the plurality of channel cards. Each one of the plurality of channel cards includes circuits configured to communicate with an integrated circuit tester. The circuits comprise a plurality of switches for selectively routing a signal conveyed on one of a plurality of integrated circuit input/output pads to a device signal panel. The device signal panel is configured to be connectable to a debug device.

The present invention further contemplates an apparatus for debugging an integrated circuit during integrated circuit test comprising a probe card and a device signal panel coupled to the probe card. The probe card comprises a first plurality of conductive pads for conveying signals conveyed on a plurality of integrated circuit input/output pads and a connector for routing signals from the first plurality of conductive pads to the device signal panel. The device signal panel is configured to be connectable to a debug device.

The present invention still further contemplates a channel card for use in a test head of an integrated circuit tester comprising a plurality of conductive metal studs, a plurality of switches, and a conductor. Each of the plurality of switches is electrically coupled to a respective one of the plurality of conductive metal studs and to a conductor. Each of the plurality of switches has a first position in which the respective one of the plurality of conductive metal studs is electrically coupled to the conductor, and a second position in which the respective one of said plurality of conductive metal studs is electrically isolated from the conductor. The second conductor is for connecting the channel card to the integrated circuit tester and to a device signal panel.

The present invention further contemplates a probe card comprising a plurality of conductive pads for conveying signals conveyed on a plurality of integrated circuit input/output pads and a connector for routing signals from the plurality of conductive pads to a device signal panel.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
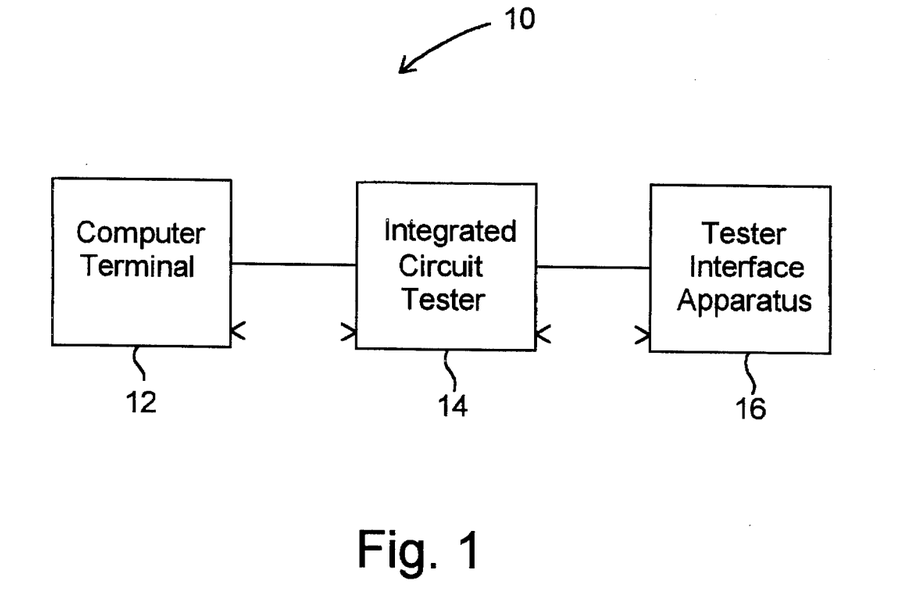
FIG. 1 is a block diagram of components of an automated semiconductor test equipment including a tester interface apparatus.

Turning now to FIG. 1, a block diagram depicting components of one embodiment of automated semiconductor test equipment 10 is shown. Automated semiconductor test equipment 10 includes a computer terminal 12, an integrated circuit tester 14, and a tester interface apparatus 16.

Computer terminal 12 is included to execute the software that controls integrated circuit tester 14. The software and computer terminal 12 provide a user interface to integrated circuit tester 14. Typically, the operator of automated semiconductor test equipment 10 works with computer terminal 12 and does not directly manipulate integrated circuit tester 14. The operator manipulates tester interface apparatus 16 to place the DUT into tester interface apparatus 16 but performs the tests from computer terminal 12. Also, output from integrated circuit tester 14 is displayed upon the screen of computer terminal 12. For example, when a failure is detected, information pertinent to the failure is displayed upon the screen of computer terminal 12. The output of sensors included within integrated circuit tester 14 is additionally displayed upon the screen of computer terminal 12.

Integrated circuit tester 14 includes the electrical devices necessary to perform various tests, some of which are listed above, on an integrated circuit. Integrated circuit testers include any module of hardware elements for sensing and transmitting electrical signals between terminal 12 and tester interface apparatus 16. A suitable integrated circuit tester can be obtained from Teradyne, Inc. of Boston, Mass., model no. J971. Integrated circuit tester 14 typically includes a limited debug capability. In one embodiment, integrated circuit tester 14 includes an oscilloscope (sensor) for debug purposes. However, due to the long leads between integrated circuit tester 14 and tester interface apparatus 16, the oscilloscope is limited to debug of slower speed circuits (e.g., circuits operating below 25 MHz). Additionally, power supply and ground pins of a DUT are not observable from a typical integrated circuit tester 14. However, power supply and ground voltage levels may be important to observe for debugging purposes. For example, power supply or ground noise may be affecting the results of the test. Additionally, a user may wish to verify that the proper voltages are being applied to the power supply and ground pins of the DUT.

Tester interface apparatus 16 includes the electrical and physical devices necessary to interface integrated circuit tester 14 to the DUT. Typically, integrated circuit tester 14 is housed in a relatively large cabinet which may not be moved easily. Furthermore, integrated circuit tester 14 is a sensitive electrical device that may become uncalibrated if moved. Tester interface apparatus 16 is typically coupled to a movable stand so that it may be placed relatively near other devices. In one embodiment, tester interface apparatus 16 includes a test head containing multiple channel cards. An exemplary test head is provided with the J971 model manufactured by Teradyne, Inc. The test head is an enclosure for channel cards and is coupled to the movable stand. The test head employs multiple ribbon cables encased in a flexible protective enclosure to connect its enclosed channel cards to integrated circuit tester 14. A ribbon cable is a specialized electrical connector consisting of multiple, parallel, equal-length conductors connected to each other with an insulating material such that they form a relatively flat, relatively wide cable resembling a ribbon. Typically, a plastic connector is coupled to each end of the ribbon cable for connecting the cable to electrical devices.

Each channel card within the test head is configured to connect multiple input/output pins (or pads) from the DUT to integrated circuit tester 14. The test head and the channel cards will be explained in more detail below.

Figure 2:
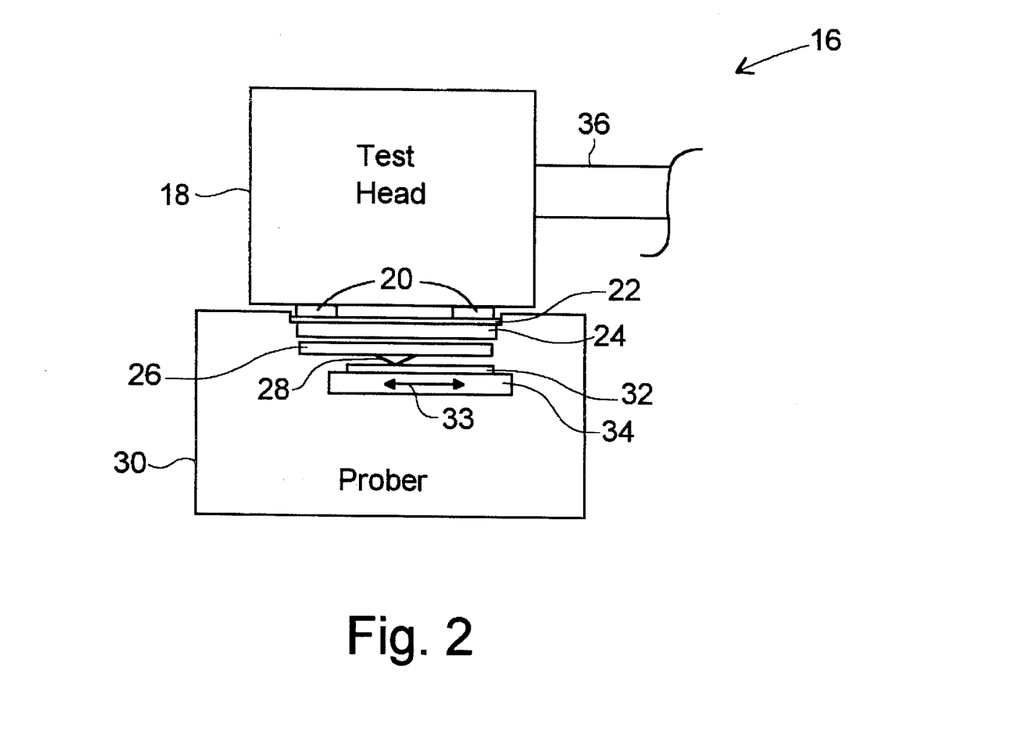
FIG. 2 is a diagram showing one configuration of the tester interface apparatus in accordance with the present invention.

Turning now to FIG. 2, components of one configuration of tester interface apparatus 16 are shown. FIG. 2 depicts a wafer test configuration. Test head 18 is coupled to a prober 30. Protective enclosure 36 houses the ribbon cables which connect the channel cards within test head 18 to integrated circuit tester 14. Projecting from test head 18 into electrical contact with other components of the wafer test configuration are contacts formed from conductive metal studs 20. Conductive metal studs 20 will be shown in more detail with respect to FIGS. 4 and 5.

The number of channel cards coupled into test head 18 depends on the number of input/output pins the DUT is configured with. In one embodiment, each channel card is capable of connecting to eight signal input/output pins. A separate power supply card which is physically the same as a channel card provides power supply pins. The voltages conveyed on the power supply pins may be controlled via computer terminal 12 (shown in FIG. 1). In one embodiment, 24 channel cards are included for a total of 192 signal input/output pins. Channel cards are arranged in a circular fashion around a central aperture through test head 18 such that conductive metal studs 20 lie along radial lines from the center of test head 18 to the exterior of test head 18.

Conductive metal studs 20 are electrically coupled to a device interface board 22 which is configured with conductive pads arranged to align with conductive metal studs 20. Device interface board 22 is configured the same way for any integrated circuit that may be tested by automated semiconductor test equipment 10. Coupled to device interface board 22 is a pogo ring 24. Pogo ring 24 is a plastic ring containing multiple pogo pins, which connect the conductive pads on device interface board 22 to conductive pads on a probe card 26. Pogo pins are spring-loaded pins configured to be compressed by a small amount. Each pogo pin is a pair of pins with the spring coupled therebetween. The pogo pin may be compressed by an amount permitted by the spring. Pogo pins ensure proper electrical connection by being compressed between device interface board 22 and probe card 26. Even if device interface board 22, pogo ring 24, and probe card 26 are not perfectly parallel with each other, the pogo pins may maintain electrical contact between device interface board 22 and probe card 26. Exemplary pogo pins are spring probes manufactured by Everett Charles Technologies of Pomona, Calif. Pogo ring 24 is also a standard device within tester interface apparatus 16 that is not changed when testing different integrated circuits.

Probe card 26 is unique to each integrated circuit design. Probe card 26 is configured with an outer ring of conductive pads which provide electrical connection to the pogo pins of pogo ring 24. An inner ring of probe tips 28 are included on probe card 26. The probe tips 28 extend from probe card 26 to the DUT. Because different integrated circuits are configured with different numbers of input/output pins and have different physical dimensions, probe card 26 is redesigned for each integrated circuit tested by automated test equipment 10.

In FIG. 2, a wafer 32 containing fabricated integrated circuits is shown. Prober 30, which houses the device interface board, the pogo ring, and the probe card, is configured to move a chuck 34 which holds wafer 32 along a horizontal plane shown by reference number 33 such that a particular integrated circuit on wafer 32 electrically contacts probe tips 28. Chuck 34 is additionally capable of vertical movement when horizontal movement is applied. When a particular integrated circuit has been fully tested, chuck 34 retracts from probe tips 28 via vertical movement. Horizontal movement along plane 33 is performed to align the next integrated circuit to be tested. Then, chuck 34 moves vertically to permit electrical contact between the next integrated circuit and probe tips 28. In this manner, integrated circuits may be tested. Tests that the operator of automated semiconductor test equipment 10 wishes to perform upon the integrated circuit are performed, and the results are recorded by integrated circuit tester 14 and stored within computer terminal 12. It is noted that prior to begin tests on a wafer, the wafer must be aligned such that a proper electrical connection is made between probe pins 28 and each DUT. The alignment process will be explained in more detail below. An exemplary embodiment of prober 30 is models 4085X or 4080X manufactured by Electroglas of Santa Clara, Calif.

The difficulty in accessing the DUT for debug purposes while configured into test position can be seen in FIG. 2. The tester interface apparatus 16 does not maintain sufficient clearance to easily allow physical access to the DUT. Probe card 26, pogo ring 24, device interface board 22, test head 18, and prober 30 interfere with such access. Therefore, debug devices cannot easily be connected to the DUT to determine the cause of test failures.

Figure 3:
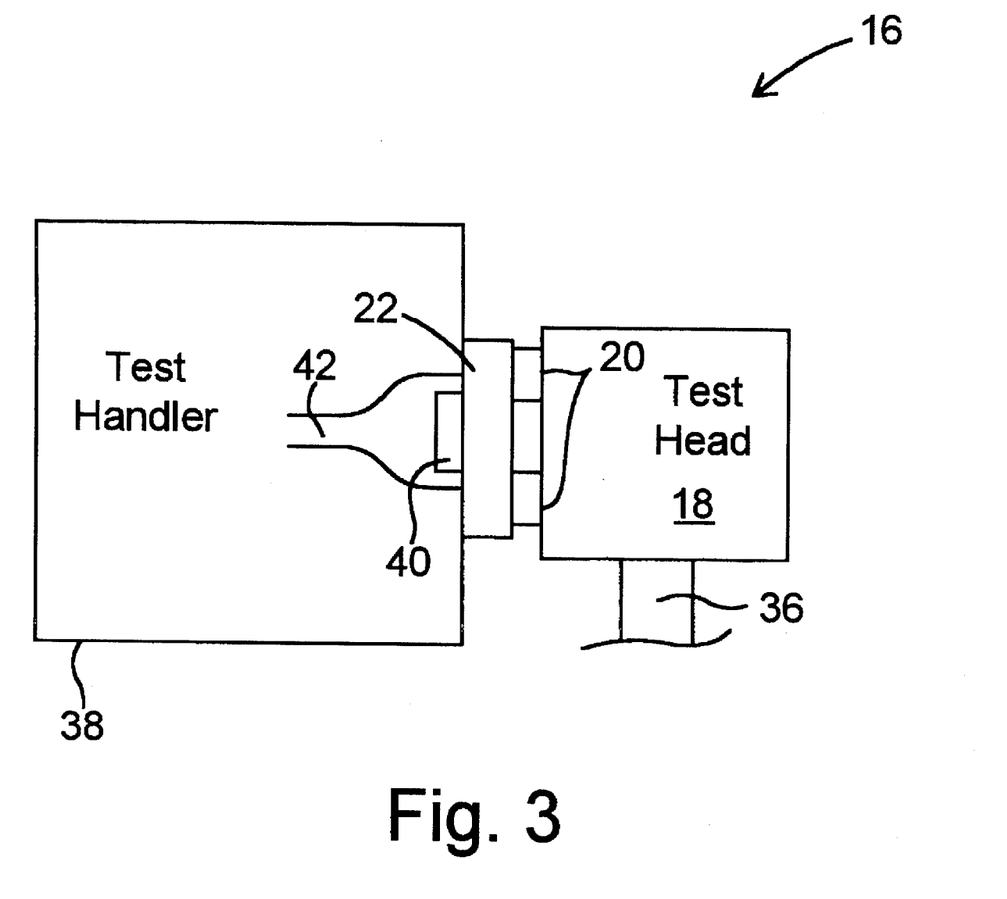
FIG. 3 is a diagram showing another configuration of the tester interface apparatus in accordance with the present invention.

Turning now to FIG. 3, a second embodiment of tester interface apparatus 16 is shown. This embodiment is used for chip test. Test head 18 is included as in the embodiment of FIG. 2. In this embodiment, however, test head 18 is preferably rotated 90 degrees with respect to its position in FIG. 2. Therefore, the conductive metal studs 20 from the channel cards within test head 18 extend laterally instead of vertically from test head 18. Test head 18 is placed next to test handler 38 (in close proximity to test handler 38) as opposed to the configuration during wafer test (as shown in FIG. 2). Test handler 38 is configured with a movable chuck 42 coupled to machinery (not shown) within test handler 38. The machinery guides chuck 42 to select a packaged integrated circuit 40 for testing, and guides chuck 42 to the appropriate collection bin (not shown) after testing is completed. One collection bin is used for integrated circuits which pass all tests, and other collection bins are used for integrated circuits which fail a particular test. Often, multiple fail bins are used to log the number of different defects which are detected and to allow for later examination of the defective integrated circuits. An exemplary test handler is the Deltaflex model manufactured by Delta Design of San Diego, Calif.

Device interface board 22 is used in this embodiment along with a chip interface connector (not shown) for interfacing to integrated circuit 40. Device interface board 22 and the chip interface connector are configured over an aperture formed into test handler 38. Chuck 42 positions integrated circuit 40 within the aperture such that it makes electrical contact with device interface board 22 and the chip interface connector. Again, access to the DUT is limited by device interface board 22 and test head 18.

Figure 4:
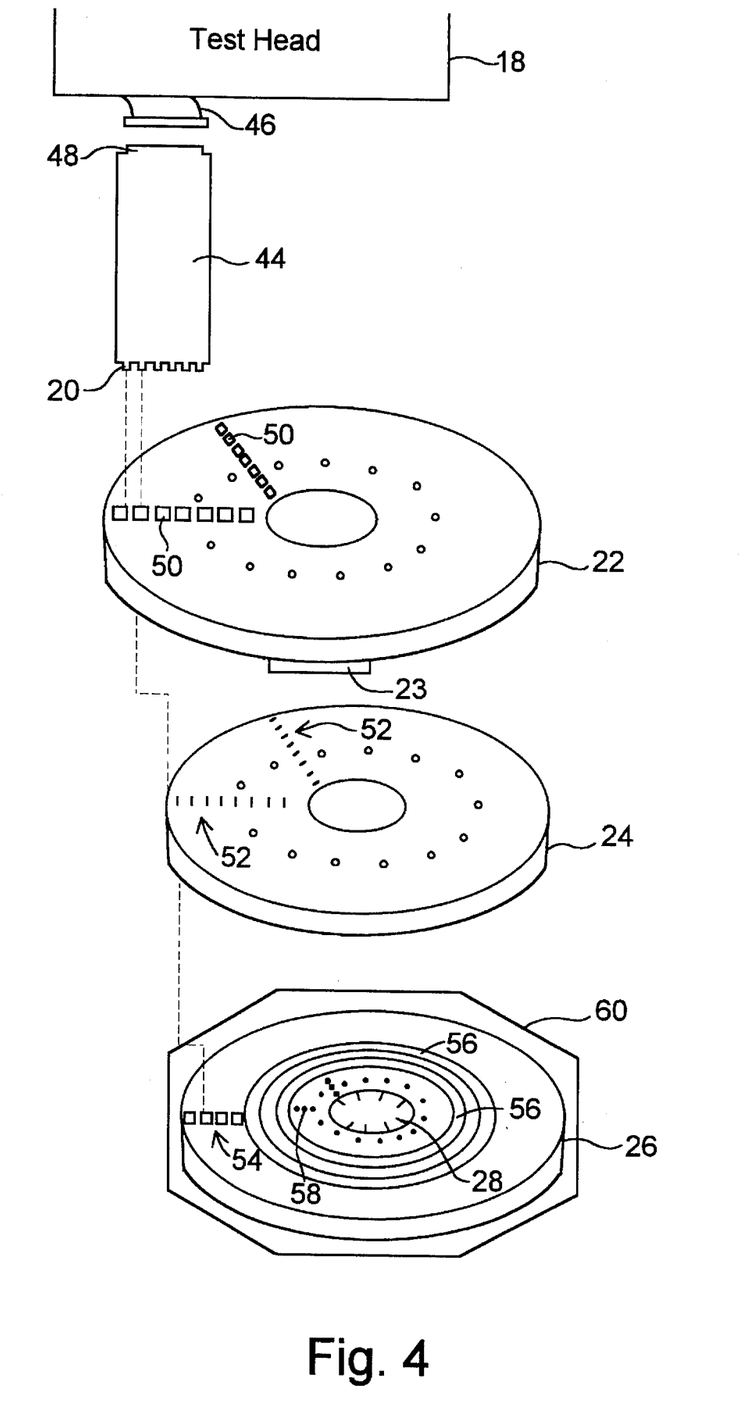
FIG. 4 is an exploded view of several components shown in FIG. 2.

Turning now to FIG. 4, an exploded view of some of the components of FIG. 2 is shown. Included on the diagram is test head 18, a channel card 44, a ribbon cable 46, device interface board 22, pogo ring 24, and probe card 26.

Channel card 44 is a printed circuit board (PCB) fabricated from standard materials. Channel card 44 is configured with an edge connector 48 which is coupled to ribbon cable 46. Edge connector 48 consists of strips of conductive material on one or both sides of the PCB forming channel card 44. The strips of conductive material are parallel to each other and are aligned on the edge connector such that electrical contact will be made with conductive strips within the ribbon cable connection of ribbon cable 46. Each strip of conductive material contacts one conductive strip within the ribbon cable connector. As previously mentioned, channel card 44 contains circuits which are configured to convey signals from ribbon cable 46 (placed within housing 36 of FIG. 2) to conductive metal studs 20, and from conductive metal studs 20 to ribbon cable 46.

In one embodiment, channel card 44 is capable of connecting to eight signal pins (or pads) of the DUT. In this embodiment, channel card 44 is configured with sixteen conductive metal studs 20 (not all of conductive metal studs 20 are shown in FIG. 4). Conductive metal studs 20 which convey signals are separated by conductive metal studs 20 which are coupled to ground. This configuration prevents signals from electrical coupling to each other as they pass from pins (or pads) of the DUT through probe card 26, pogo ring 24, device interface board 22, and into conductive metal studs 20. The ground connections in between each signal connection therefore provide electrical isolation for the signal pins.

Device interface board 22 is of substantially circular cross section and contains radial lines of conductive pads 50 which, when device interface board 22 is installed in prober 30 or test handler 38, align with conductive metal studs 20 on channel card 44. Device interface board 22 is configured with edges 23 (one of which is shown in FIG. 4) to which a compressive clamp on prober 30 or test handler 38 attaches to hold device interface board 22 in place. Dotted lines between conductive metal studs 20 and conductive pads 50 indicate this alignment. One conductive pad 50 contacts each of the conductive metal studs 20. Only two radial lines of conductive pads 50 are shown for sake of brevity. However, it is known that numerous radial lines of conductive pads 50 are configured onto device interface board 22 as indicated by the ellipses drawn on device interface board 22. One radial line of conductive pads 50 is included for each channel card installed in test head 18. Conductive pads 50 are formed entirely through device interface board 22 such that conductive pads 50 appear on the lower surface of device interface board 22 in substantially the same pattern as on the upper surface of device interface board 22.

A circular aperture is formed through the circular surface of device interface board 22 such that the center of the aperture lies at the center of device interface board 22's circular surface. This aperture aligns with an aperture formed through the center of test head 18 and similar apertures through pogo ring 24 and probe card 26. A fiber optic camera is placed through these apertures to aid in the alignment process when a wafer is first selected by prober 30 for testing. The camera scans the portion of the wafer which is visible between the ends of probe tips 28 of probe card 26, and relays the image to prober 30. Chuck 34 of prober 30 (shown in FIG. 2) moves wafer 32 until a predefined pattern (which is fabricated on the wafer specifically for alignment purposes) is located. Having located a predetermined spot on the wafer, the integrated circuits which have been fabricated onto the wafer may then be located by moving the wafer from this know position.

Pogo ring 24 is also substantially circular in cross section and has an aperture formed through it as mentioned above. Pogo pins 52 are configured along radial lines upon the upper surface of pogo ring 24 so as to align to conductive pads 50 when pogo ring 24 and device interface board 22 are coupled into prober 30. A pogo pin 52 electrically connects to each conductive pad 50. Only two radial lines of pogo pins 52 are shown in FIG. 4 for sake of brevity. However, it is understood that pogo ring 24 is configured with numerous radial lines of pogo pins 52 as indicated by the ellipses drawn. In particular, one radial line of pogo pins 52 is included for each radial line of conductive pads 50 on device interface board 22.

Pogo ring 24 is provided to electrically couple conductive pads 50 to respective conductive pads 54. A particular pogo pin 52 may connect a particular conductive pad 50 to a conductive pad 54 which is not directly beneath the particular conductive pad 52. For example, conductive pads 50 which convey ground and power supply pins are connected to concentric ground rings and power rings 56 which separate conductive pads 54 from a set of trace connections 58. Trace connections 58 are electrically isolated from conductive pads 54 by power and ground rings 56. Although a pair of power and ground rings 56 are shown in FIG. 4, multiple power and ground rings may be included on probe card 26. Each trace connection 58 is electrically coupled to a conductive pad 54 and to a probe tip 28. Each probe tip 28 is configured to electrically contact a particular input/output pad on the integrated circuit which probe card 26 is designed to accommodate. Therefore, a signal on an input/output pad of the DUT would pass through probe tip 28, trace connection 58, conductive pad 54, pogo pin 52, conductive pad 50, conductive metal stud 20, channel card 44, edge connector 48 and ribbon cable 46 before arriving in integrated circuit tester 14.

As shown in FIG. 4, probe card 26 is surrounded by a metallic octagonal collar 60. Metallic collar 60 serves to secure probe card 26 to prober 30. Probe card 26 is secured to prober 30 such that it may not rotate from its installed position. In one embodiment, the metallic octagonal collar is made of stainless steel.

Trace connections 58 are provided to allow a particular probe tip 28 to be connected to any conductive pad 54. Typically, a conductive wire is soldered between a trace connection 58 and a desired conductive pad 54.

Figure 5:
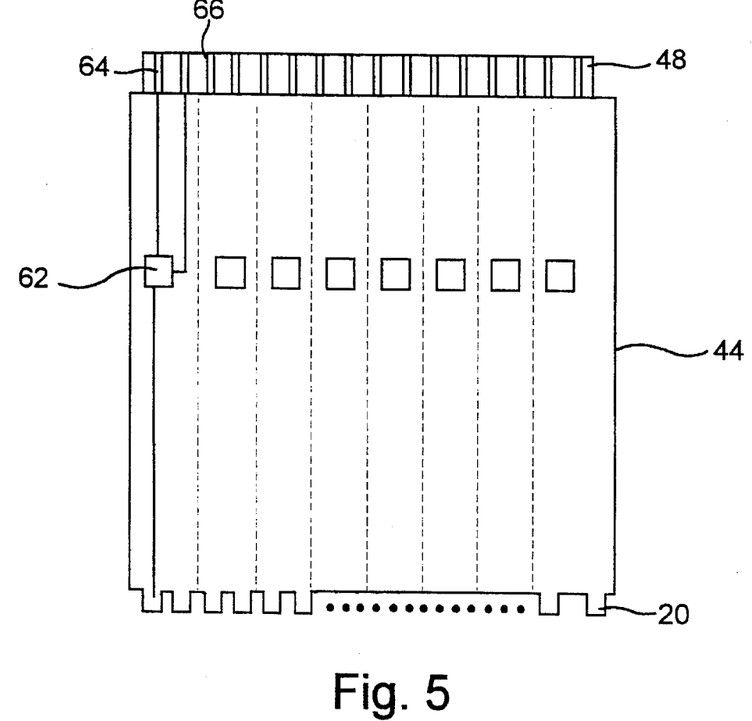
FIG. 5 is a diagram of a channel card in accordance with the present invention.

Turning now to FIG. 5, an embodiment of channel card 44 is shown in more detail. Channel card 44 is configured in this embodiment with eight substantially identical sets of circuits (forming a channel) as indicated by the dotted lines within channel card 44. The lines are for illustrative purposes only, any suitable layout for the particular circuits embodied on channel card 44 may be used.

Each channel of channel card 44 is allocated two conductive metal studs 20. As discussed above, one conductive metal stud 20 is capable of conveying a signal. The other conductive metal stud is electrically coupled to ground. Circuits included on channel card 44 for communication of signals to and from integrated circuit tester 14 and the DUT are not shown in FIG. 5. However, switch 62 is shown along with its electrical connections for one of the channels within channel card 44. Switch 62 is configured to selectively connect a conductor 64 on edge connector 48 to the signal being conveyed on the conductive metal stud 20 for this channel. Switch 62 selects to connect or disconnect conductor 64 under the control of a second signal provided on a second conductor 66 from edge connector 48. Other conductors (not shown) from edge connector 48 are coupled to the channel for other functions. The second signal is controlled by integrated circuit tester 14, and is selected by the user through software executing on computer terminal 12. Each channel is configured with a switch 62, and in one embodiment each switch is independently controllable from integrated circuit tester 14 via signals conveyed to conductor 66 and similar conductors for other channels (not shown).

In one embodiment, switch 62 is a CMOS transistor with a gate coupled to conductor 66 and source and drain connected to conductor 64 and the conductive metal stud 20 which conveys the signal. In another embodiment, switch 62 is a relay. It is noted that other suitable circuits may be used to implement switch 62. Conductor 64 is connected to a conductor within ribbon cable 46, and that conductor is connected to a device signal panel on test head 18 (as will be shown in FIG. 6).

Figure 6:
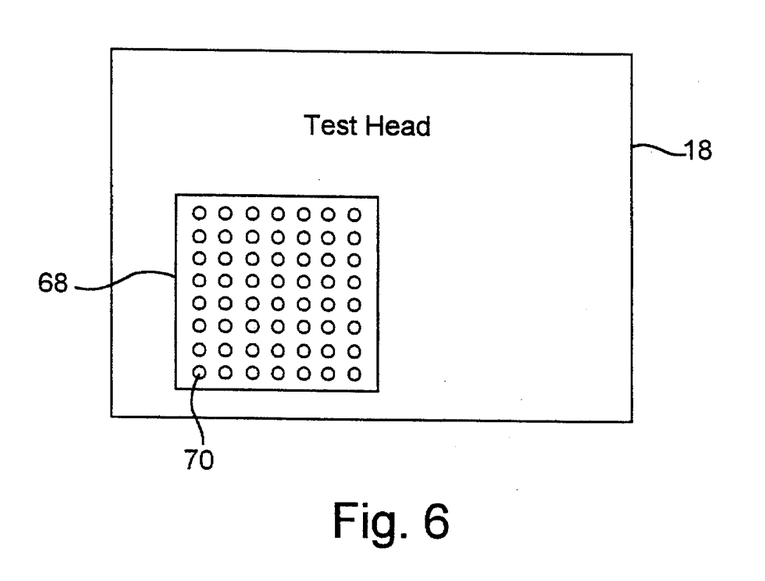
FIG. 6 is a diagram of a test head in accordance with the present invention.

Turning now to FIG. 6, test head 18 is shown with a device signal panel 68 preferably attached to a side panel of test head 18. Device signal panel 68 is a printed circuit board with connection points 70 which are suitable for connection to debug devices. In one embodiment, connection points 70 are test point pins formed out of a conductive metallic material such as aluminum or copper. The conductive metallic material is then gold plated. Conductors from ribbon cable 46 and similar ribbon cables connected to other channel cards 44 are electrically coupled to various connection points 70 on device signal panel 68. Therefore, signals from the DUT are connected to connection points 70, and are thereby accessible to a debug device coupling connectable to connection points 70. Connection points 70 are configured to extend inward and outward from the side panel of test head 18. Inward extending points couple to terminal ends of ribbon cable 46, and outward extending points are accessible to the debug device. A debug device coupled co device signal panel 68 allows for a relatively short lead length. Thus, higher frequency debugging operation may be performed. Each connection point 70 is labeled such that the channel card 44 and the respective channel of that channel card (which is electrically connected to that connection point) may be discerned by the operator of automated test equipment 10.

Figure 7:
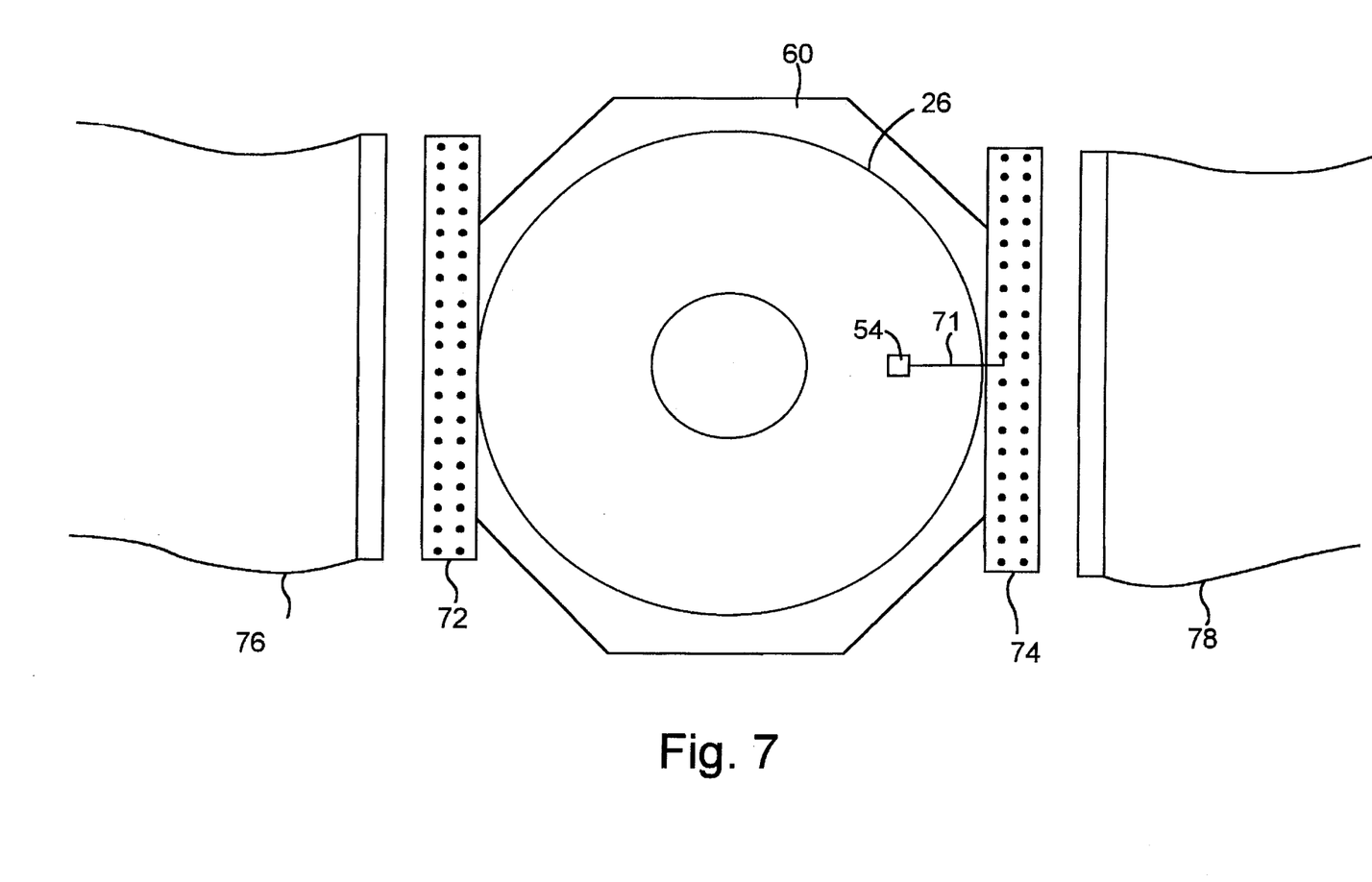
FIG. 7 is a diagram of a probe card in accordance with the present invention.
Figure 8:
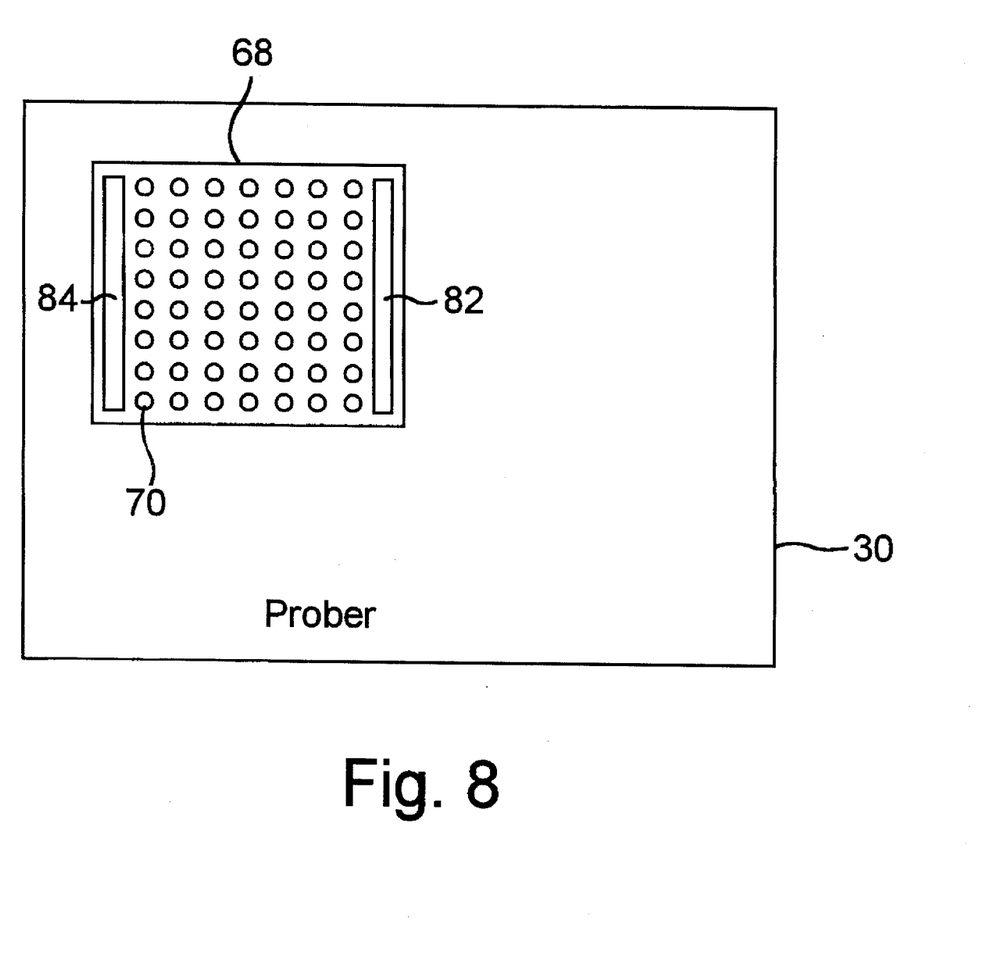
FIG. 8 is a diagram of a prober in accordance with the present invention.

Turning now to FIGS. 7 and 8, another embodiment of device signal panel 68 and its connections to the DUT is shown. FIG. 7 depicts probe card 26 (conductive pads 54, power and ground rings 56, trace connections 58 and probe tips 28 are not shown). Two ribbon cable connectors 72 and 74 are coupled 180 degrees apart to a metallic collar 60. In one exemplary embodiment, these connectors are formed from plastic and contain 212 pin connections. An exemplary conductive pad 54 is shown in FIG. 7 with a wire conductor 71 connecting conductive pad 54 to connector 74. Each conductive pad 54 is electrically coupled to the connector 72 or 74 nearest that particular conductive pad. Therefore, conductor length between the conductive pad 54 and the associated connector 72 or 74 is minimized. Ribbon cables 76 and 78 are provided to connect between respective connectors 72 and 74 and device signal panel 68.

Turning now to FIG. 8, an embodiment of device signal panel 68 is shown. As with the embodiment shown in FIG. 6, device signal panel 68 is a PCB configured with connection points 70. However, this embodiment of device signal panel 68 is also configured with ribbon cable connectors 82 and 84 placed at terminal ends of ribbon cables 76 and 78. At the other terminal ends of ribbon cables 76 and 78 are connectors 72 and 74, shown in FIG. 7.

As shown in FIG. 8, device signal panel 68 is coupled in this embodiment to a side panel of prober 30. Since probe card 26 is housed within prober 30, ribbon cables 76 and 78 need only extend form connectors 72 and 74 to the side of prober 30. Thus, the ribbon cables are configured across the top of prober 30 between prober 30 and test head 18. The ribbon cables are relatively short as compared to ribbon cables connecting test head 18 to integrated circuit tester 14. Therefore, debugging may be performed at speeds greater than when the debug is performed on the integrated circuit tester 14.

In accordance with the above disclosure, two embodiments of a debug apparatus for automated test equipment have been described. The debug apparatus allows access to the DUT through the device signal panel, as opposed to through the integrated circuit tester. Relatively short conductor lengths are used, enabling debugging to be performed with tests executing at a higher clock speed than previous debug apparatus allowed. Additionally, access to the power supply and ground pins of the DUT is provided, enabling additional debug capabilities unavailable utilizing conventional integrated circuit testers. Advantageously, debug may be performed upon integrated circuits while under test by coupling a debug device to the device signal panel. Both integrated circuit problems and tester problems may be isolated more quickly, allowing for subsequent correction.

Numerous variations and modifications will become apparent to those skilled in the art once the above disclosure is fully appreciated. It is intended that the following claims be interpreted to embrace all such variations and modifications.

What is claimed is:

1. An integrated circuit debug apparatus comprising:
    a test head;
    a device signal panel connected to a side panel of said test head, wherein said device signal panel includes a plurality of electrical connectors dimensioned to receive a debug device electrically connectable thereto; and
    a plurality of channel cards coupled within said test head, each said channel card includes a plurality of conductors switchably connected between a respective integrated circuit bonding pad and a respective electrical connectors of said device signal panel.

2. The integrated circuit debug apparatus as recited in claim 1, wherein each said plurality of conductors comprises a conductive path operably connected by a switch configured within the conductive path.

3. The integrated circuit debug apparatus as recited in claim 1, further comprising a ribbon cable coupled between said channel cards and said device signal panel.

4. The integrated circuit debug apparatus as recited in claim 1, wherein said side panel is configured proximate to said plurality of channel cards.

5. The integrated circuit debug apparatus as recited in claim 2, wherein said switch is operably controlled independent of other switches within other conductive paths of said plurality of conductors.

6. The integrated circuit debug apparatus as recited in claim 1, wherein said plurality of conductors are switchably connected such that a signal conveyed on one of said integrated circuit bonding pad is routed to a corresponding electrical connector during a time when another signal conveyed on another one of said integrated circuit bonding pads is not routed to said device signal panel.

7. The integrated circuit debug apparatus as recited in claim 1, further comprising an integrated circuit tester connected to said test head, and a computer terminal coupled to said integrated circuit tester for providing a user interface to said integrated circuit tester.

8. The integrated circuit debug apparatus as recited in claim 1, further comprising a device interface board coupled to said test head such that said plurality of channel cards are electrically coupled to said device interface board.

9. The integrated circuit debug apparatus as recited in claim 8, wherein said device interface board is configured with a chip interface connector configured to connect to a test handler.

10. The integrated circuit debug apparatus as recited in claim 8, wherein each one of said plurality of channel cards is configured with a plurality of conductive metal studs, and wherein said electrical coupling between said plurality of channel cards and said device interface board is provided by causing said conductive metal studs to contact said device interface board.

11. The integrated circuit debug apparatus as recited in claim 10, wherein said device interface board is configured with a first plurality of conductive pads arranged such that each one of said first plurality of conductive pads contacts one of said conductive metal studs when said device interface board is coupled to said test head.

12. The integrated circuit debug apparatus as recited in claim 11, further comprising a pogo ring having a plurality of pogo pins wherein said pogo ring is coupled to said device interface board such that each one of said plurality of pogo pins is electrically coupled to a respective one of said first plurality of conductive pads.

13. The integrated circuit debug apparatus as recited in claim 12, further comprising a probe card having a second plurality of conductive pads wherein said probe card is coupled to said pogo ring such that each one of said second plurality of conductive pads is electrically coupled to a respective one of said plurality of pogo pins.

14. The integrated circuit debug apparatus as recited in claim 13, wherein said probe card includes a plurality of probe tips for electrically coupling to a plurality of integrated circuit input/output pads wherein each one of said plurality of probe tips is electrically coupled to a respective one of said second plurality of conductive pads.

15. An apparatus for debugging an integrated circuit during integrated circuit test, comprising:

a device signal panel connected to a side panel of a probe unit, said device signal panel is adapted for electrical connection to a debug device; and a probe card coupled within said probe unit, wherein said probe card includes a first plurality of conductive pads electrically connectable between said device signal panel and a respective plurality of integrated circuit bonding pads.

16. The apparatus as recited in claim 15, further comprising a ribbon cable coupled between said conductive pads on said probe card and said device signal panel.

17. The apparatus as recited in claim 15, wherein said device signal panel is a printed circuit board having a plurality of spaced connectors, each of which is selectable for connection to said debug device.

18. The apparatus as recited in claim 15, wherein said device signal panel is coupled proximate to said probe card.

19. The apparatus as recited in claim 15, further comprising a pogo ring having a plurality of pogo pins wherein said pogo ring is coupled to said probe card such that each one of said plurality of pogo pins is electrically coupled to a respective one of said first plurality of conductive pads.

20. The apparatus as recited in claim 19 further comprising a device interface board having a second plurality of conductive pads wherein said probe card is coupled to said pogo ring such that each one of said second plurality of conductive pads is electrically coupled to a respective one of said plurality of pogo pins.

21. The apparatus as recited in claim 15, wherein said probe card includes a plurality of probe tips for electrically coupling to a plurality of integrated circuit input/output pads wherein each one of said plurality of probe tips is electrically coupled to a respective one of said first plurality of conductive pads.

22. A channel card for use in a test head of an integrated circuit tester comprising: a plurality of conductive metal studs and a plurality of first conductors;

a plurality of switches selectably coupled between respective said plurality of conductive metal studs and respective said plurality of first conductors, said switches are operable in a first position during times in which said conductive metal studs is electrically coupled to said first conductors, and wherein said switches are operable in a second position during times in which said conductive metal studs are electrically isolated from said first conductors; and a plurality of second conductors connected between said integrated circuit tester and a device signal panel.

23. A probe card comprising:

a plurality of conductive pads for receiving signals on a plurality of integrated circuit bonding pads; and a connector for routing signals from said plurality of conductive pads to a device signal panel adapted for receiving a debug device.

* * * * *